United States Patent [19]

Takamura et al.

[11] Patent Number: 5,233,430
[45] Date of Patent: Aug. 3, 1993

[54] SOLID STATE IMAGER WITH A MATRIX OF ARRAYS WHEREIN THE HORIZONTAL TRANSFER IS ACCOMPLISHED WITH FIRST AND SECOND CLOCK VOLTAGES AND THE CROSS-OVER POINT BETWEEN THE FIRST AND SECOND CLOCK VOLTAGES IS AT A LEVEL WHICH IS ABOVE THE MEDIUM LEVEL

[75] Inventors: Yoji Takamura, Kanagawa; Kazuya Yonemoto, Tokyo; Naoki Nishi; Manabu Ishibashi, both of Kanagawa, all of Japan

[73] Assignee: Sony Corporation, Tokyo, Japan

[21] Appl. No.: 821,827

[22] Filed: Jan. 17, 1992

[30] Foreign Application Priority Data

Jan. 18, 1991 [JP] Japan .................. 3-19563

[51] Int. Cl.⁵ ............... H04N 3/14; H04N 5/335
[52] U.S. Cl. ............ 358/213.23; 358/213.15; 358/213.31; 257/248
[58] Field of Search ............ 358/213.23, 213.29, 358/213.31, 213.15, 213.11; 357/24 LR

[56] References Cited

U.S. PATENT DOCUMENTS

| | | | |
|---|---|---|---|
| 4,654,713 | 3/1987 | Boucharlat et al. | 358/213.29 |
| 4,839,734 | 6/1989 | Takemura | 358/213.29 |
| 4,949,143 | 8/1990 | Iesaka et al. | 358/213.23 |

FOREIGN PATENT DOCUMENTS

| | | | |
|---|---|---|---|
| 0324650 | 7/1989 | European Pat. Off. | |
| 63-283058 | 11/1988 | Japan | 358/213.23 |
| 63-285968 | 11/1988 | Japan | 358/213.23 |
| 2-014571 | 1/1990 | Japan | 358/213.23 |

OTHER PUBLICATIONS

Japanese publication JP56000096 published Jan. 6, 1981.

*Primary Examiner*—Michael T. Razavi
*Assistant Examiner*—Wendy R. Greening
*Attorney, Agent, or Firm*—Hill, Steadman & Simpson

[57] ABSTRACT

A solid state imager is comprised of an imager unit composed of a plurality of sensitive units arrayed in the unit of pixels in a two-dimensional manner in the horizontal and vertical directions and vertical transfer units for transferring electric charges read-out from the sensitive units in the vertical direction at every vertical column, and a horizontal transfer unit formed of charge transfer unit group $(8_1, 8_2, 8_3, \ldots)$ of a plurality of bits in which a clock voltage $(\phi_{H1})$ is applied to a first charge transfer unit group $(8_1, 8_3, \ldots)$ at every other bit including the charge transfer unit $(8_1)$ of a final bit and a clock voltage $(\phi_{H2})$ is applied to a second charge transfer unit group $(8_2, 8_4, \ldots)$ at every other bit of the remaining bit to transfer the electric charges supplied from the image unit in the horizontal direction, wherein a cross point between a leading edge of the clock voltage $(\phi_{H1})$ and a trailing edge of the clock voltage $(\phi_{H2})$ is set to be a level higher than an intermediate level between peak values of the clock voltages. Thus, a so-called electric charge flooding phenomenon from the final bit (final stage) of the horizontal transfer unit to the output circuit unit can be prevented and therefore the dynamic range of the final bit can be increased relatively.

6 Claims, 5 Drawing Sheets

SOLID STATE IMAGER WITH A MATRIX OF ARRAYS WHEREIN THE HORIZONTAL TRANSFER IS ACCOMPLISHED WITH FIRST AND SECOND CLOCK VOLTAGES AND THE CROSS-OVER POINT BETWEEN THE FIRST AND SECOND CLOCK VOLTAGES IS AT A LEVEL WHICH IS ABOVE THE MEDIUM LEVEL

BACKGROUND OF THE INVENTION

1. Field of the Invention

The present invention generally relates to solid state imagers and, more particularly, is directed to a solid state imager in which a dynamic range of a final bit in a horizontal transfer unit is improved.

2. Description of the Prior Art

FIG. 1 shows a structure of a solid state imager of, for example, an interline transfer type as an example of a conventional solid state imager.

Referring to FIG. 1, it will be seen that an imager unit 3 is formed of a plurality of sensitive units 1 arrayed in the unit of pixels in the horizontal and vertical directions for storing electric charges corresponding to an amount of an incident light and a vertical transfer unit composed of a plurality of vertical shift registers 2 for transferring electric charges instantly read out from these sensitive units 1 during one portion of a vertical blanking period at every vertical column. In the imager unit 3, each of the sensitive units 1 is formed of, for example, a photodiode and each of the vertical shift registers 2 is formed of a charge coupled device (CCD). An electric charge read out to the vertical shift register 2 is sequentially transferred to a horizontal shift register (horizontal transfer unit) 4 at its every portion corresponding to one line by driving the vertical shift register 2 by 4-phase clock voltages $\phi_{V1}$ to $\phi_{V4}$ during one portion of the horizontal blanking period. The horizontal shift register 4 is formed of a CCD. An electric charge of one line is sequentially transferred to the horizontal direction by driving the horizontal shift register 4 by 2-phase clock voltages $\phi_{H1}$ and $\phi_{H2}$. An output circuit unit 5 formed of a floating diffusion amplifier (FDA) or the like is provided at the final stage of the horizontal shift register 4. The output circuit unit 5 converts electric charges, which are photo-electrically-converted by the sensing unit 1 and vertically and horizontally transferred, into voltages and then derives the same as a signal output voltage OUT.

In the CCD solid state imager thus arranged, as is clear from FIG. 2 which shows a sectional structure of the horizontal shift register 4, the horizontal shift register 4 is constructed as follows: As shown in FIG. 2, a plurality of transfer electrodes $8_1, 8_2, \ldots, 8_n$, each formed of electrode pair of bilayer structure are arrayed, for example, on a silicon semiconductor substrate 6 via an insulating film 7 in the transfer direction and one electrode of each electrode pair and the other electrode thereof are coupled each other as a transfer unit TR and a storage unit ST, thereby the horizontal shift register 4 being constructed as charge transfer units (transfer electrodes) of a plurality of bits. Then, transfer electrode groups ($8_1, 8_3, \ldots$) of every other bit involving the transfer electrode $8_1$ of the final bit are commonly coupled and other transfer electrode groups ($8_2, 8_4, \ldots$) of every other bit are similarly commonly coupled and the clock voltages $\phi_{H1}$ and $\phi_{H2}$ of the same waveform shown in FIG. 3 are applied to these two sets of transfer electrode groups, thereby the horizontal shift register 4 being driven in a two-phase fashion. A gate electrode 9 is formed at the rear stage of the transfer electrode $8_1$ of the final bit on the substrate 6 through the insulating layer 7 to thereby construct a horizontal output gate unit HOG.

In the above-mentioned horizontal shift register 4, a dynamic range of the electric charge transfer unit (transfer electrode $8_1$) of the final bit (final stage) is determined by a difference between a potential of the horizontal output gate unit HOG and a potential of the storage unit ST in the transfer electrode $8_1$ of the final bit unlike the electric charge transfer unit of other bit. As a consequence, before electric charges are transferred to the output circuit unit 5 (see FIG. 1), when electric charges are stored in the transfer electrode $8_1$ of the final bit, electric charges are stored from the transfer electrode $8_2$ to the transfer electrode $8_1$ and simultaneously electric charges are transferred from the transfer electrode $8_1$ through the horizontal output gate unit HOG to the floating diffusion portion (FD) which is the output circuit unit 5 from a timing relation of the clock voltages $\phi_{H1}$ and $\phi_{H2}$ as shown in a potential diagram of FIG. 4. That is, electric charges are overflowed at the horizontal output gate unit HOG and flowed to the floating diffusion portion FD, which phenomenon will hereinafter be referred to as an electric charge flooding phenomenon for simplicity. If this electric charge flooding phenomenon occurs, there is then the problem that the dynamic range of the final bit becomes smaller than the dynamic range obtained from a principle standpoint.

In order to increase the dynamic range of the final bit, the following methods are proposed:

(1) To increase the amplitudes of the clock voltages $\phi_{H1}$ and $\phi_{H2}$ for horizontal transfer driving; and (2) To apply other clock voltage only to the final bit. The method (1) becomes opposite to the recent trend such that the clock voltage is lowered more and more. Further, the method (2) causes the number of terminals to be increased and also causes a clock voltage generator to become complicated in arrangement.

On the other hand, there is a large possibility that the above-mentioned so-called electric charge flooding phenomenon occurs when the amplitude of the clock voltage applied to the transfer electrode $8_1$ of the final bit is selected to be the same as that of the clock voltage applied to the other transfer electrode. At that time, the electric charge flooding phenomenon is associated with the phase of the leading edge of the clock voltage $\phi_{H1}$ and the phase of the trailing edge of the clock voltage $\phi_{H2}$ and the assignee of the present application has confirmed that the above-mentioned electric charge flooding phenomenon occurred when the cross point P therebetween was at low level.

OBJECTS AND SUMMARY OF THE INVENTION

Therefore, it is an object of the present invention to provide an improved solid state imager in which the aforesaid shortcomings and disadvantages encountered with the prior art can be eliminated.

More specifically, it is an object of the present invention to provide a solid state imager which can prevent the aforesaid flooding phenomenon in which electric charges are flooded from the final bit (final stage) of the horizontal transfer unit to the output circuit unit.

It is a second object of the present invention to provide a solid state imager in which a dynamic range of the final stage can be increased.

In order to attain the above-mentioned objects, a solid state imager is comprised of an imager unit composed of a plurality of sensitive units arrayed in the unit of pixels in a two-dimensional manner in the horizontal and vertical directions and vertical transfer units for transferring electric charges read-out from the sensitive units in the vertical direction at every vertical column, and a horizontal transfer unit formed of charge transfer units of a plurality of bits in which a first clock voltage is applied to a first charge transfer group of every other bit including a charge transfer unit of a final bit and a second clock voltage is applied to a second charge transfer group of every other bit of the remaining bit to transfer the signal electric charges supplied from the image unit to the horizontal direction, wherein a cross point between a leading edge of the first clock voltage and a trailing edge of the second clock voltage is set to be a level higher than an intermediate level between peak values of the first and second clock voltages.

According to a solid state imager of the present invention, a horizontal transfer unit composed of a first charge transfer electrode group to which a first clock voltage is supplied and which includes a final bit and a second charge transfer electrode group to which a second clock voltage of a phase opposite to the first clock voltage is applied to thereby transfer electric charges in the horizontal direction, a clock generator for generating the first and second clock voltages, and a floating diffusion unit to which electric charges stored in the final bit of the horizontal transfer unit are transferred through a horizontal output gate, wherein a cross point between a leading edge of the first clock voltage and a trailing edge of the second clock voltage is set to be a level higher than an intermediate level between peak values of the first and second clock voltages. Thus, the transfer of electric charges from the charge transfer unit of the preceding bit to the charge transfer unit of the final bit is carried out at the low potential portion so that the horizontal output gate unit can function as a potential barrier sufficiently, thereby avoiding the aforesaid electric charge flooding phenomenon.

The above and other object, features, and advantage of the present invention will become apparent from the following detailed description of illustrative embodiments thereof to be read in conjunction with the accompanying drawings.

DETAILED DESCRIPTION OF THE PREFERRED EMBODIMENTS

The present invention will now be described in detail with reference to the drawings.

Figure 1:
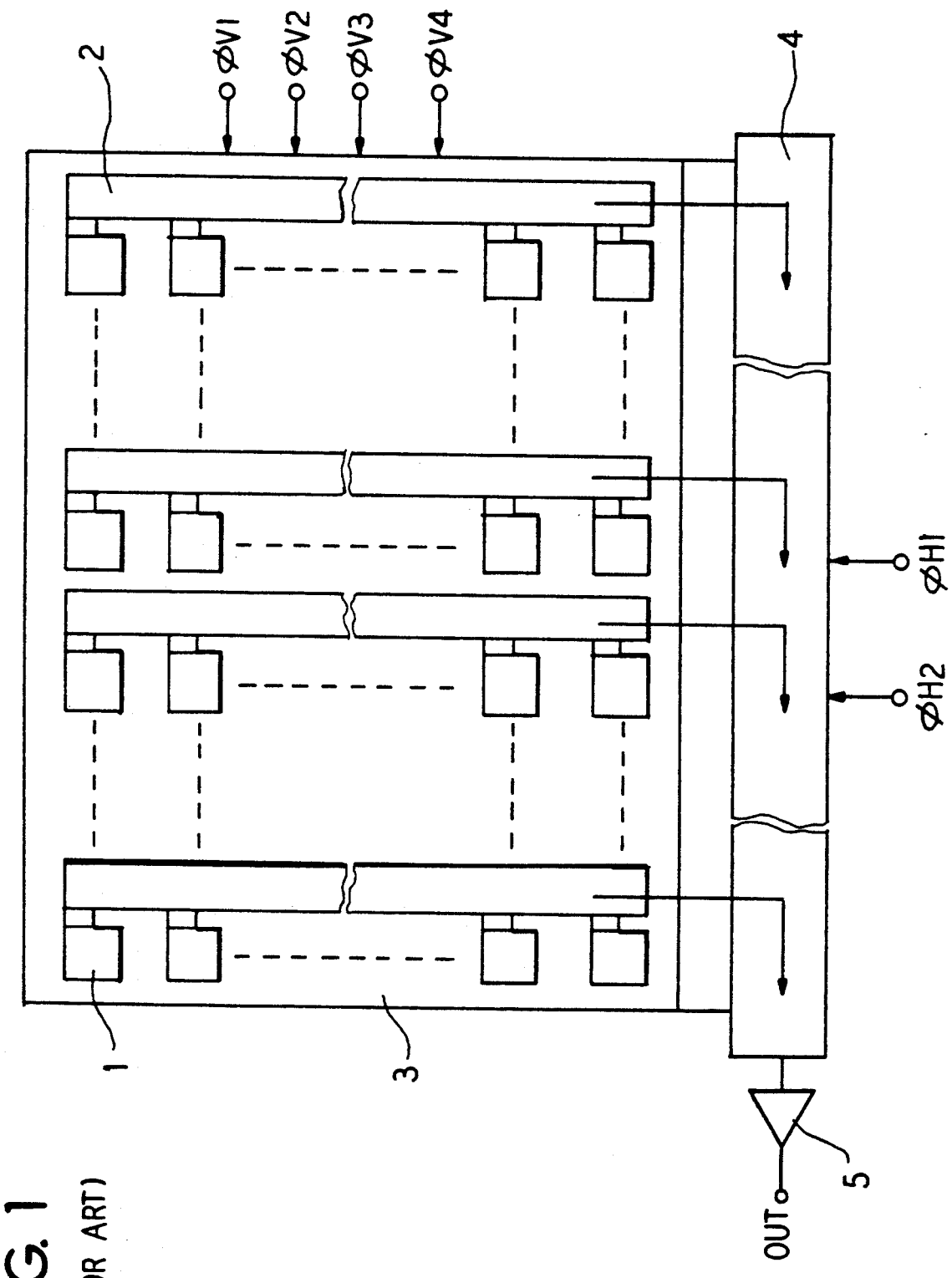
FIG. 1 is a schematic diagram showing a structure of a solid state imager of an interline transfer system according to the prior art.
Figure 2:
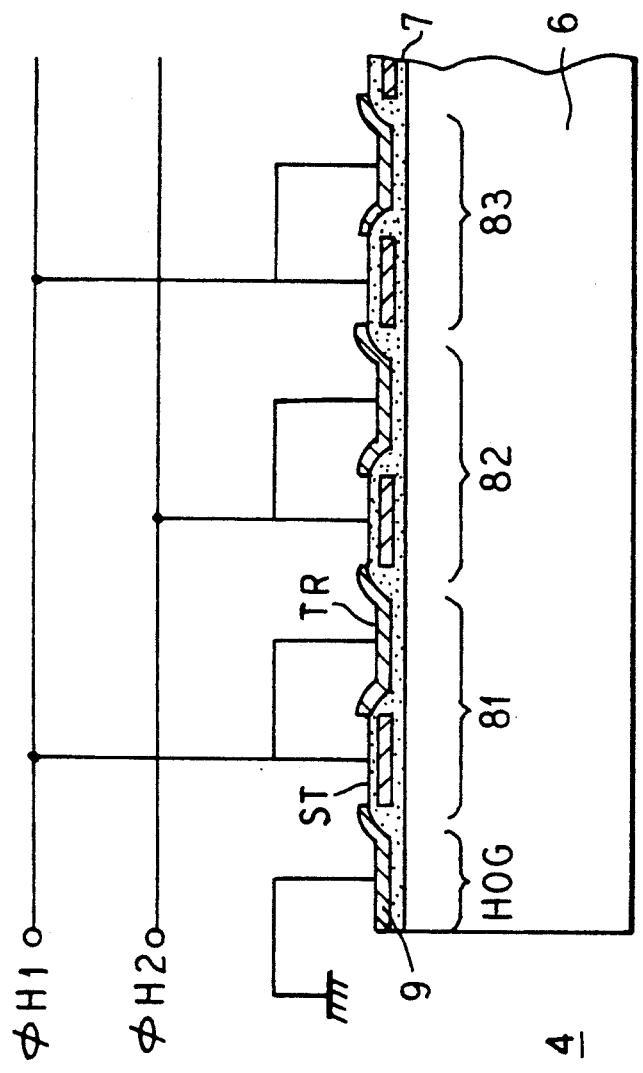
FIG. 2 is a cross-sectional view of a horizontal transfer unit of the conventional solid state imager shown in FIG. 1.
Figure 3:
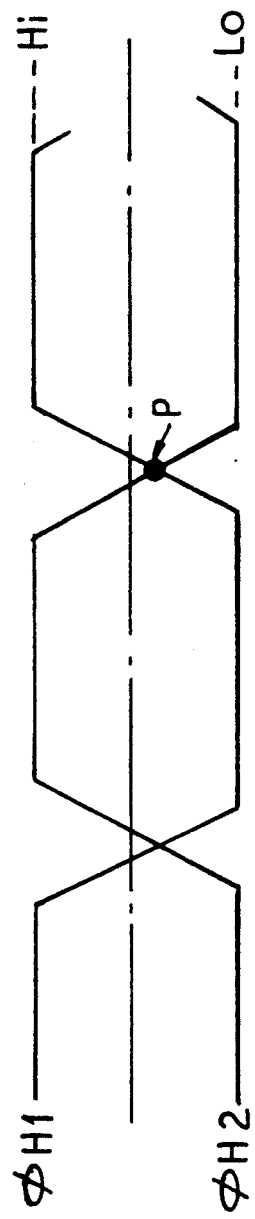
FIG. 3 is a waveform diagram showing a timing relation of clock voltages $\phi_{H1}$ and $\phi_{H2}$ according to the prior art.
Figure 4:
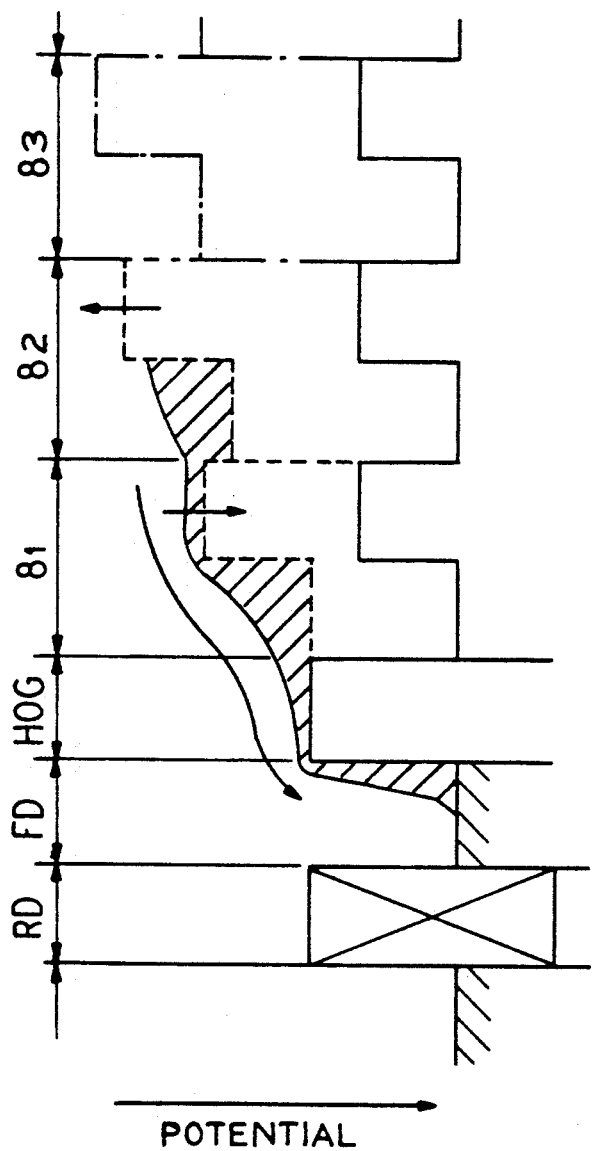
FIG. 4 is a potential diagram of the horizontal transfer unit when electric charges are transferred in the example of the conventional, solid state imager of FIG. 1.
Figure 5:
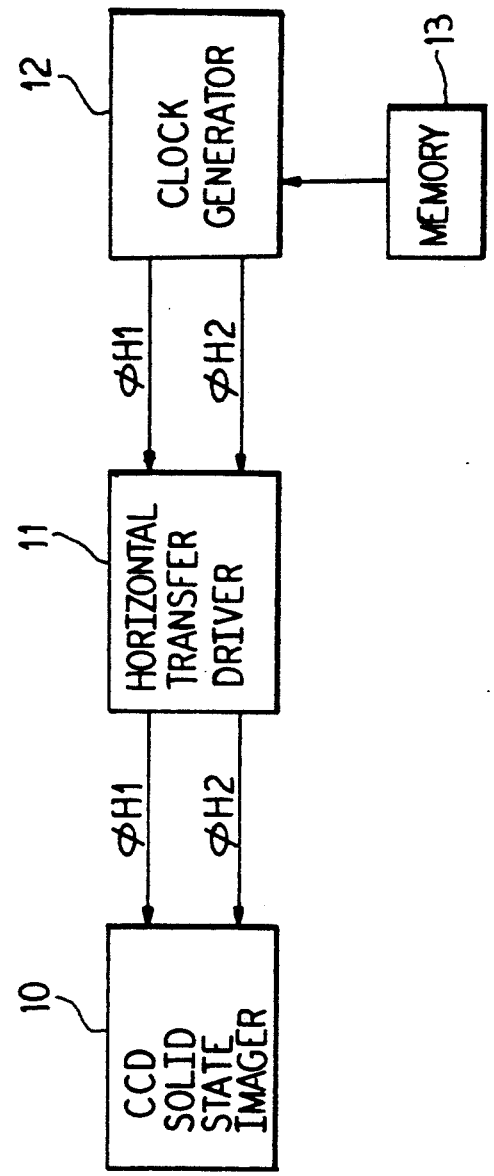
FIG. 5 is a block diagram showing an embodiment of a solid state imager according to the present invention.
Figure 6:
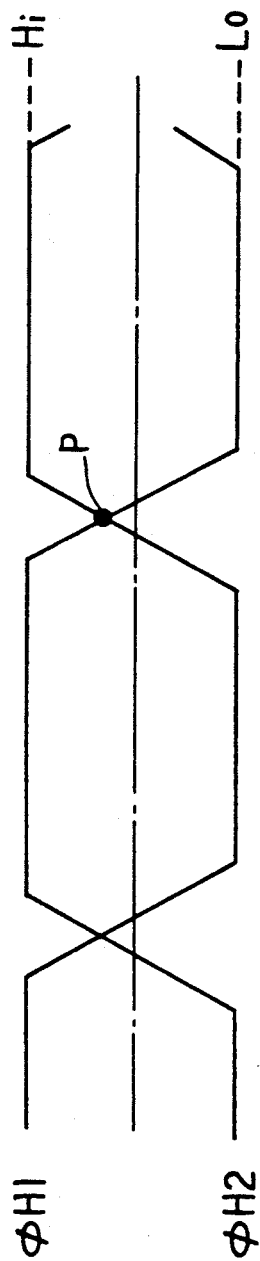
FIG. 6 is a waveform diagram showing a timing relation of clock voltages $\phi_{H1}$ and $\phi_{H2}$ used in the solid state imager according to the present invention.

FIG. 5 shows an embodiment of the solid state imager according to the present invention. Referring to FIG. 5, there is provided a CCD solid state imager 10 which might be formed as, for example, shown in FIG. 1. The horizontal shift register 4 (see FIG. 1) of this CCD solid state imager 10 is supplied with 2-phase clock voltages $\phi_{H1}$ and $\phi_{H2}$ through a horizontal transfer driver 11 from a clock generator 12. The clock generator 12 reads out data stored in a memory 13 such as a read only memory (ROM) or the like and generates 2-phase voltages $\phi_{H1}$ and $\phi_{H2}$ at a timing corresponding to such read-out data. More specifically, a duty ratio between the clock voltages $\phi_{H1}$ and $\phi_{H2}$ is set in such a fashion that a cross point P between the leading edge of the clock voltage $\phi_{H1}$ and the trailing edge of the clock voltage $\phi_{H2}$ may become higher in level than an intermediate level (shown by a one-dot chain line) between peak values of the clock voltages $\phi_{H1}$ and $\phi_{H2}$ as shown in FIG. 6. This duty ratio is given in the form of data from the memory 13, and the data of the memory 13 can be set arbitrarily. The horizontal shift register 4 is placed in the charge transfer state when the clock voltages $\phi_{H1}$ and $\phi_{H2}$ are low (Lo) in level and is placed in the charge storage state when they are high (Hi) in level.

Figure 7:
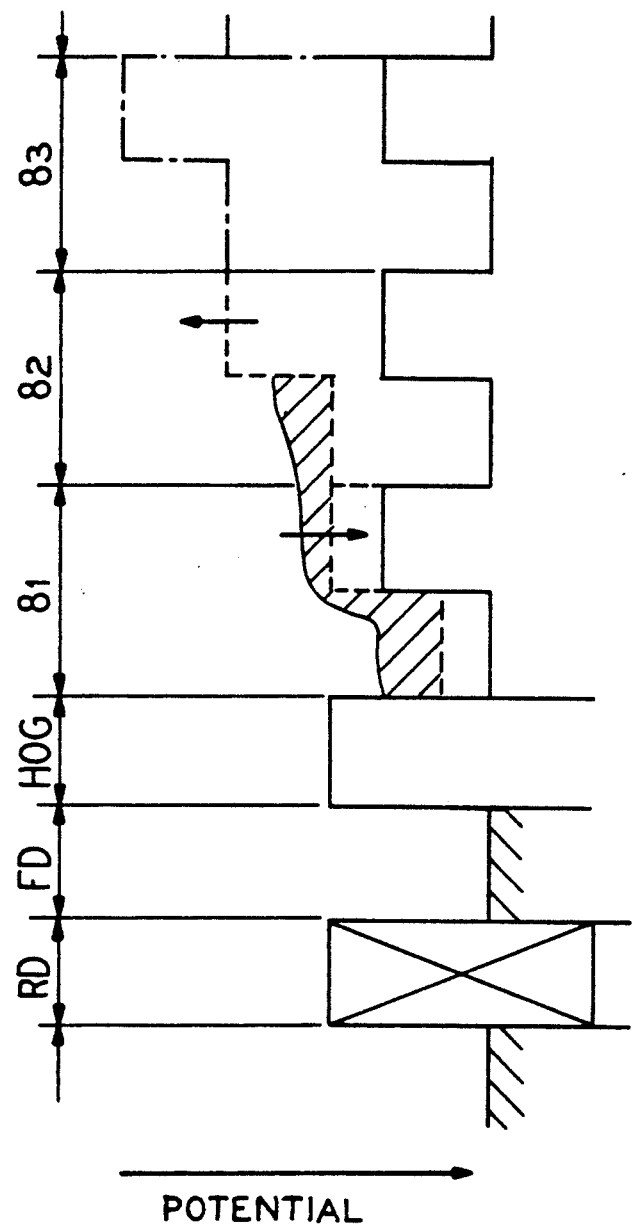
FIG. 7 is a potential diagram of a horizontal transfer unit when electric charges are transferred in the solid state imager according to the present invention.

As described above, the cross point P between the leading edge of the clock voltage $\phi_{H1}$ and the trailing edge of the clock voltage $\phi_{H2}$ is set to be the level higher than the intermediate level of the peak values of the clock voltages $\phi_{H1}$ and $\phi_2$, whereby the leading edge of the clock voltage in which the potential of the transfer electrode $8_1$ of the final bit is shifted from the transfer state to the storage state and the trailing edge of the clock voltage applied to the transfer electrode $8_2$ of the preceding bit cross each other at a point of high level. As a result, a transition time where the potential of the transfer bit $8_1$ of the final bit changes from the transfer state to the storage state becomes relatively shorter than the transition time where the potential of the transfer electrode $8_2$ of the preceding bit changes from the storage state to the transfer state. Accordingly, electric charges are transferred from the transfer electrode $8_2$ of the preceding stage to the transfer electrode $8_1$ of the final bit at low potential portions as shown in a potential diagram of FIG. 7 so that the horizontal output gate unit HOG functions as a potential barrier sufficiently, thereby preventing the electric charge flooding phenomenon positively. As a consequence, the dynamic range of the final bit can be increased relatively.

Figure 8:
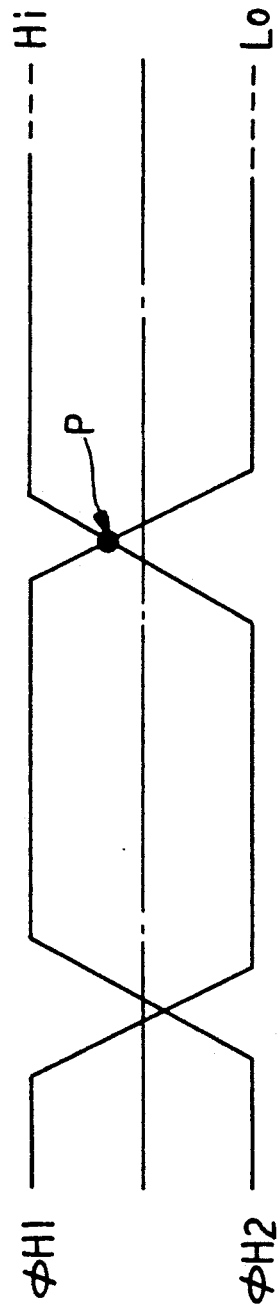
FIG. 8 is a waveform diagram showing another example of the timing relation of the clock voltages $\phi_{H1}$ and $\phi_{H2}$ used in the solid state imager according to the present invention.
Figure 9:
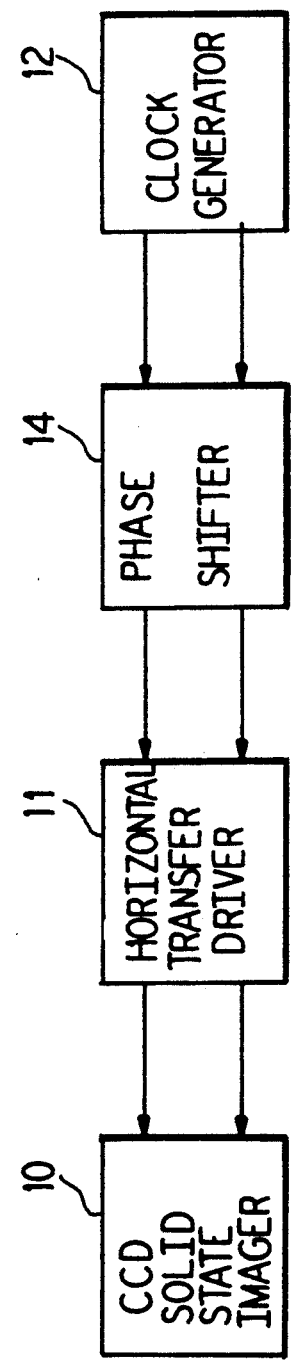
FIG. 9 is a block diagram showing another embodiment of the solid state imager according to the present invention.

While the cross point P of the leading edge of the clock voltage $\phi_{H1}$ and the trailing edge of the clock voltage $\phi_{H2}$ is set to be level higher than the intermediate level of the peak values between the clock voltages $\phi_{H1}$ and $\phi_{H2}$ by changing the duty ratio of the clock voltages $\phi_{H1}$ and $\phi_{H2}$ by the clock generator 12 as described above, the present invention is not limited thereto and the following variant is also possible: By carrying out a relative phase adjustment in which the phase of the clock voltage $\phi_{H1}$ is advanced or the phase of the clock voltage $\phi_{H2}$ is delayed, the cross point P between the leading edge of the clock voltage $\phi_{H1}$ and the trailing edge of the clock voltage $\phi_{H2}$ can be set to a level higher than the intermediate level of the peak values between the clock voltages $\phi_{H1}$ and $\phi_{H2}$ as shown in FIG. 8. This relative phase adjustment can be realized by rewriting the data supplied to the clock generator 12 from the memory 13. Further, as shown in FIG. 9, this relative phase adjustment can be realized by phase-shifting the clock voltage $\phi_{H1}$ or $\phi_{H2}$ by a phase-shifter circuit 14 provided at the output stage of the clock generator 12.

As set out above, according to the solid state imager of the present invention, since in the horizontal transfer unit the the cross point between the leading edge of the clock voltage of the electric charge transfer unit of the final bit and the trailing edge of the clock voltage of the electric charge transfer unit of the preceding bit is set to be the level higher than the intermediate level of the peak values between the clock voltages, the transfer of electric charges from the electric charge transfer unit of the preceding bit to the electric charge transfer unit of the final bit is carried out at low potential portion, enabling the horizontal output gate unit HOG to function as the potential barrier sufficiently. Therefore, the electric charge flooding phenomenon can be avoided positively and as a consequence, the dynamic range of the final bit can be increased relatively.

Having described the preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

What is claimed is:

1. A solid state imager comprising:
an imager unit composed of a plurality of sensitive units formed in a two-dimensioned array in the horizontal and vertical directions and vertical transfer units for transferring electric charges readout from said sensitive units in the vertical direction at every vertical column; and
a horizontal transfer unit formed of a plurality of first and second charge transfer units, first and second clock signals which are applied to said first and second charge transfer units so that odd bits are clocked by a first signal and even bits are clocked by a second signal, including a charge tranfer unit connected to one of said plurality of charge transfer units, to transfer the electrical charges in the horizontal direction; and
means for setting a cross point between a leading edge of said first clock voltage and a trailing edge of said second clock voltage at a level which is above the medium level between the peak values of said first and second clock voltages.

2. A solid state imager comprising:
a horizontal transfer unit formed of a plurality of first and second charge transfer units, first and second clock signals which are applied to said first and second charge transfer units so that odd bits are clocked by a first signal and even bits are clocked by a second signal, including a charge transfer unit connected to one of said plurality of charge transfer units to transfer the electrical charges in the horizontal direction; and
said first and second clock signals have opposite phases,
a clock generator for generating said first and second clock voltages; and
a floating diffusion unit to which electric charges stored in the final bit of said horizontal transfer unit are transferred through a horizontal output gate, wherein a cross point between a leading edge of said first clock voltage and a trailing edge of said second clock voltage is set at a level which is above the medium level between the peak values of said first and second clock voltages.

3. A solid state imager according to claim 2, wherein said clock generator includes means for varying a duty ratio between said first and second clock voltages and sets said cross point to a predetermined value by varying said duty ratio.

4. A solid state imager according to claim 2, wherein said duty ratio varying means is formed of a memory and said cross point is set to said predetermined value by varying data written in said memory.

5. A solid state imager according to claim 2, further comprising a phase shifting circuit coupled to an output of said clock generator and said cross point is set to said level by a phase-adjusting operation of said phase-shifting circuit.

6. A method for operating a charge transfer device comprising a horizontal charge transfer unit composed of a plurality of charge transfer electrodes which have odd electrodes, including a final bit located at the end of said horizontal charge transfer unit, and even electrodes, a floating diffusion unit to which electric charges stored in said final bit of said horizontal charge transfer unit are transferred through a horizontal output gate, said method comprising: applying a first clock voltage to said odd electrodes and a second clock voltage of a phase opposite to said first clock voltage to said even electrodes in order to transfer signal electric charges in the horizontal direction to said even electrodes, wherein a cross point between a leading edge of said first clock voltage and a trailing edge of said second clock voltage is located above an average value between the high level and the low level of said first or second clock voltage.

* * * * *